US008475598B2

(12) United States Patent
Cetel et al.

(10) Patent No.: US 8,475,598 B2

(45) Date of Patent: Jul. 2, 2013

(54) STRIP PROCESS FOR SUPERALLOYS

(75) Inventors: Alan D. Cetel, West Hartford, CT (US); Curtis Heath Riewe, Manchester, CT (US); Dwayne A. Braithwaite, Wallingford, CT (US)

(73) Assignee: United Technologies Corporation, Hartford, CT (US)

( * ) Notice: Subject to any disclaimer, the term of this patent is extended or adjusted under 35 U.S.C. 154(b) by 0 days.

(21) Appl. No.: 13/331,019

(22) Filed: Dec. 20, 2011

(65) Prior Publication Data

US 2012/0156366 A1 Jun. 21, 2012

Related U.S. Application Data

(62) Division of application No. 11/284,612, filed on Nov. 22, 2005, now abandoned.

(51) Int. Cl.
*C23G 1/02* (2006.01)
*C23C 16/00* (2006.01)

(52) U.S. Cl.
USPC ................................................ 134/3; 427/252

(58) Field of Classification Search
USPC ................................ 216/103; 134/3; 427/252
See application file for complete search history.

(56) References Cited

U.S. PATENT DOCUMENTS

| | | | | |
|---|---|---|---|---|
| 3,649,225 | A * | 3/1972 | Simmons, Jr. | 428/651 |
| 4,089,736 | A | 5/1978 | Fisher et al. | |
| 4,148,936 | A | 4/1979 | Grisik et al. | |
| 5,499,905 | A | 3/1996 | Schmitz et al. | |
| 5,500,252 | A | 3/1996 | Meelu | |
| 5,882,439 | A | 3/1999 | Nakahama | |
| 6,833,328 | B1 * | 12/2004 | Kool et al. | 438/745 |
| 2004/0055669 | A1 | 3/2004 | Gell et al. | |
| 2004/0069748 | A1 | 4/2004 | Kryzman et al. | |
| 2004/0244910 | A1 * | 12/2004 | Albrecht et al. | 156/345.11 |

FOREIGN PATENT DOCUMENTS

| | | | |
|---|---|---|---|
| EP | 0587341 | A1 | 3/1994 |
| EP | 0846788 | A1 | 6/1998 |
| EP | 0948660 | A1 | 10/1999 |
| EP | 1418255 | A1 * | 5/2004 |
| GB | 2115013 | A | 9/1983 |
| WO | 8907159 | A1 | 8/1989 |
| WO | 02103088 | A1 | 12/2002 |
| WO | 2006061431 | A2 | 6/2006 |

OTHER PUBLICATIONS

Scrivani A., et al.; "Removal of Thermal Barrier Coatings from Turbine Blades: A comparison of mechanical and chemical methods" Proc. Int. Therm. Spray Conf.: Proceedings of the International Thermal Spray Conference 2001, pp. 207-210. XP009079490.

* cited by examiner

*Primary Examiner* — Kelly M Gambetta
(74) *Attorney, Agent, or Firm* — Bachman & LaPointe, P.C.

(57) ABSTRACT

A process for forming a coated substrate comprises providing a nickel base alloy substrate, depositing a chromium coating onto the nickel base alloy substrate and diffusing chromium from said coating into the substrate, applying a MCrAlY coating onto the nickel base alloy substrate and heat treating the substrate with the deposited chromium and the MCrAlY coating so that chromium diffuses into an outer region of the substrate. Further, in accordance with the present invention, a strip process for removing a coating from a substrate broadly comprises the steps of providing a nickel base alloy substrate having chromium diffused into an outer region and a MCrAlY coating deposited over the substrate with the diffused chromium and removing the MCrAlY coating by immersing the nickel base alloy substrate in an acid solution containing a sulfuric acid-hydrochloric acid mixture in water.

5 Claims, 3 Drawing Sheets

Trailing Edge Leading Edge

STRIP PROCESS FOR SUPERALLOYS

The instant application is a divisional application of U.S. Ser. No. 11/284,612, filed Nov. 22, 2005, entitled STRIP PROCESS FOR SUPERALLOYS.

BACKGROUND OF THE INVENTION (1) Field of the Invention

The present invention relates to a process for removing a coating from a substrate made from a nickel-base superalloy and to a process for treating a nickel-base superalloy.

(2) Prior Art

Cast nickel-base superalloys used in turbine engine components can be coated with MCrAlY type overlay coatings that typically contain about 8-12% aluminum. These coatings extend the life of the components that they are applied to. Some nickel-base superalloys contain a high volume fraction of γ/γ' eutectic phase which is highly enriched in aluminum and of relatively large scale (up to about 5-10 mils in diameter) compared to the surrounding microstructure. Solution heat treatment of such alloys does not fully eliminate these phases.

During manufacturing rework or aftermarket repair, coatings are removed using mineral acids. 70-100 v/o hydrochloric acid is typically used to remove MCrAlY type coatings which preferentially leaches the aluminum in coatings containing relatively elevated levels of aluminum, but does not attack the base alloy which contains much lower levels of aluminum. On a significant number of coating and base alloy systems, the mineral acids used preferentially attack the coating without significant chemical attack or corrosion of the base alloys. The result is that the coating is removed without damaging the part. However, alloys having high volume fractions of γ/γ' eutectic phase have exhibited more base alloy pitting type attack than similar alloys with low volume fractions of the γ/γ' eutectic phase. This is in part due to the hydrochloric acid selectively attacking the large surface connected aluminum enriched eutectic phases. Consequently, a need exists for a coating strip process to remove MCrAlY type coatings from these alloys having high volume fractions of γ/γ' eutectic phase with minimal base ally attack.

SUMMARY OF THE INVENTION

In accordance with the present invention, it has been determined that alloys which contain high volume fractions of γ/γ' eutectic phase can have their MCrAlY coatings stripped, with reduced amounts of pitting attack, by employing an improved chemical stripping process in accordance with the present invention.

In accordance with the present invention, a chemical stripping process is provided which can be used to remove MCrAlY coatings from a wide variety of turbine engine components.

In accordance with the present invention, a process for forming a coated substrate broadly comprises providing a nickel base alloy substrate, depositing a chromium coating onto the nickel base alloy substrate and diffusing chromium from the chromium coating into an outer region of the substrate, applying MCrAlY coatings onto the nickel base alloy airfoil and under-root platform substrate having the deposited chromium coating.

In accordance with the present invention, a strip process for removing a coating from a substrate broadly comprises the steps of providing a nickel base alloy substrate having chromium diffused into an outer region and a MCrAlY coating deposited over said substrate with said diffused chromium, and removing said MCrAlY coating by immersing said nickel base alloy substrate in an acid solution containing a sulfuric acid—hydrochloric acid mixture in water.

Other details of the strip process for superalloys of the present invention, as well as other objects and advantages attendant thereto, are set forth in the following detailed description and the accompanying drawings wherein like reference numerals depict like elements.

DETAILED DESCRIPTION OF THE PREFERRED EMBODIMENT(S)

Figure 1:
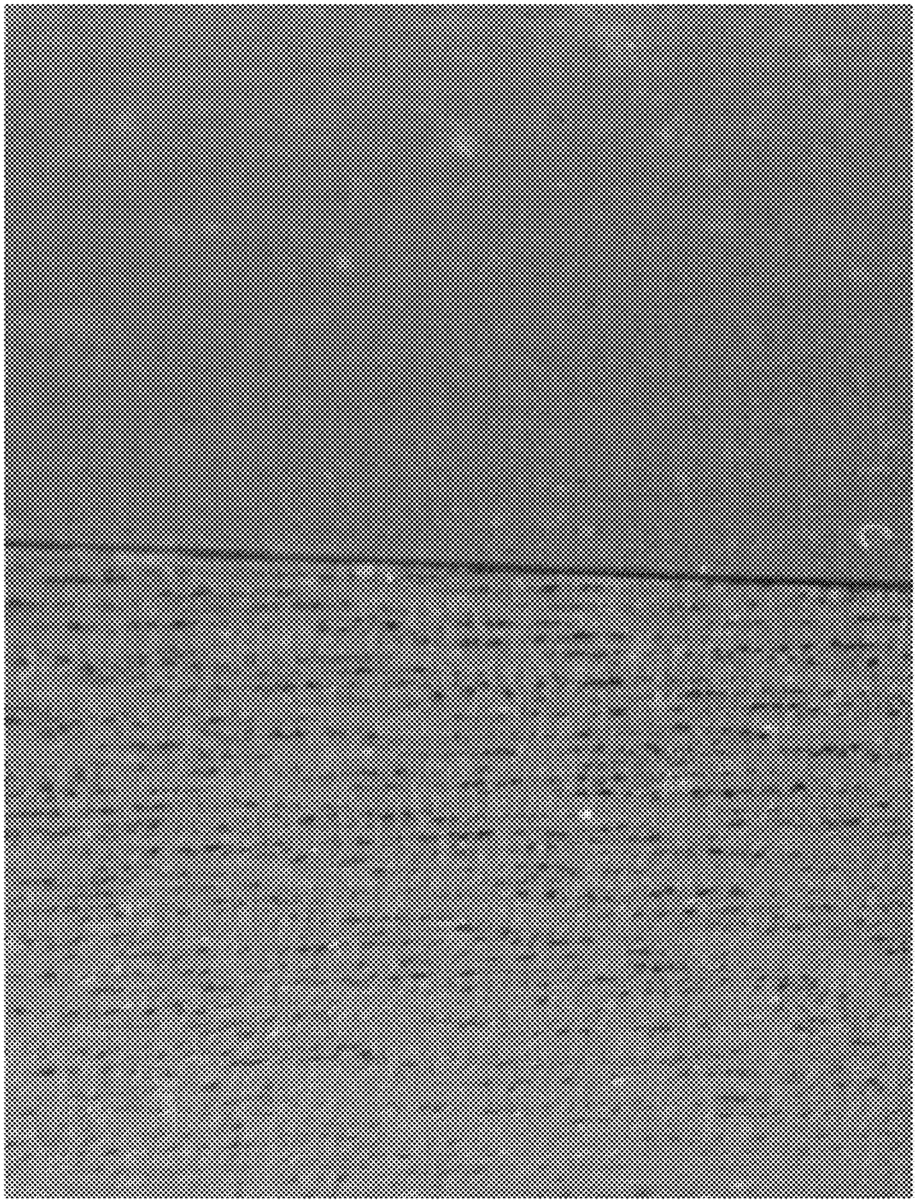
FIG. 1 is a side by side photographic comparison of a trailing edge of an airfoil portion of a turbine engine component whose coating had been stripped with a prior art stripping solution vs. a leading edge portion of a turbine engine component whose coating had been stripped using the stripping solution of the present invention.

The present invention relates to a strip process for removing a coating from a substrate formed from a nickel-based superalloy and to a process for treating a nickel-base superalloy to improve removal of a coating such as a MCrAlY coating.

In accordance with the present invention, a turbine engine component formed from a nickel-based superalloy, such as one having a high volume fraction of γ/γ' eutectic phase which is highly enriched in aluminum and of relatively large scale (up to about 5-10 mils in diameter) has a chromizing coating applied to surfaces to be coated. The chromizing coating may comprise a layer of chromium deposited onto each surface to be coated. Any suitable process known in the art may be used to deposit the chromium layer, such as, but not limited to, chemical vapor deposition processes with a deposit thickness of less than approximately 0.5 mils. The chromizing coating treatment may be applied during manufacture of the turbine engine component. Additionally, the chromizing coating may be re-applied during overhaul and repair of the component.

The chemical vapor deposition process which may be used to apply the chromizing coating may be either a gas phase (out-of-contact) or pack cementation process. The chromizing coating is applied to improve the corrosion resistance of the nickel-based superalloy forming the substrate. Using the chromizing coating treatment of the present invention, base alloy chrome levels of between 5-10 wt %, are increased to between 15-30 wt %, at the surface, for a depth of between 0.2 and 1.5 mils, preferably a depth in the range of from between 0.2 to 0.8 mils. The chromizing coating may be deposited over a wide range of temperatures, preferably around 1700 to 2150 degrees Fahrenheit.

In accordance with the present invention, the chromizing coating consists mainly of chromium in solution with gamma nickel. The gamma prime phase is removed by the partial transfer of the aluminum from the alloy forming the substrate to the coating source material or is tied up by internal oxidation just below the original interface, which is caused by the oxygen potential sustained by the chromium-chromium oxide system. The chromizing coating is formed in much the same way as a high activity aluminide process. Major constituents in the chromizing reaction are $CrX_2$, $CrX_3$, HX and $H_2$, where X refers to the halide used for the activator. The halide used for the activator may be selected from the group consisting of chloride, fluoride, iodide, or bromide. A chloride activation in the form of ammonium chloride may be used for the chromizing process.

Using a gas phase process, chrome is transported to the alloy's surface where it is deposited and then is diffused inward as a result of the heat being applied. Besides the main chemical reaction, there is also secondary contribution made by the hydrogen reduction reaction. There is very little additive coating above the original interface. Small amounts of alpha chrome can build up at the surface, especially when applied at lower temperature. This layer is generally no more than 5 microns in thickness. It occurs when the chrome diffusion into the alloy can not keep pace with gaseous deposition and may also deposit as the coating system cools down at the completion of the coating cycle.

In a preferred embodiment for depositing the chromizing coating, a pure chrome source is used. This source can be granules or powder of chromium. The powder can either be mixed with an inert material, such as aluminum oxide, or pressed and fused into briquettes. The source is combined with a small amount of activator, such as ammonium chloride, usually under 20 grams, which is somewhat dependent on the coating vessel's size. The turbine engine components to be coated may be prepared by cleaning (degreasing or burnout) and grit blasting with 220 mesh aluminum oxide. Typically, the source material and activator are placed at the bottom of the coating vessel and the turbine engine components are suspended above the source. The coating vessel may be closed with a lid, but is not necessarily sealed. The coating vessel is then placed in a sealed retort and placed under a gas cover gas of argon or, in some case, hydrogen. Hydrogen can have a beneficial effect on the process because of the contribution of the hydrogen reduction reaction in the coating process itself. Nitrogen is typically avoided because of nitriding effects on the coating as well as the source material. The retort is heated to a temperature in the aforementioned range. The temperature is held for a time period between 5 and 20 hours. If needed, more than one coating cycle may be employed in order to get the desired thickness or chrome content on hard to coat alloys. After completion of the chromizing process, the turbine engine components are removed from the coating vessels and water washed to remove any particulate and residual coating by-products like hydrochloric acid, which may condense on the part when cooling down.

Preferably, the chromium level in the chromizing coating is maintained at as high a level as possible and, particularly, at a level greater than 20 wt % Most preferably, the chromium level in the outer region of the substrate is maintained in the range of from 20 to 30 wt %. Maintaining a high chromium content is important to insure that the coating can prevent hot corrosion attack of the root in service and also to serve as an effective barrier to base alloy pitting during coating stripping.

After the chromizing coating has been deposited, a coating, such as a MCrAlY coating containing about 8 to 15 wt % aluminum, is deposited over the chromizing coating layer. The coating may be deposited using any suitable technique known in the art, such as, but not limited to, a low pressure plasma spray technique or a cathodic arc process for coating airfoil portions of a turbine engine component and a cathodic arc coating technique for coating under-root platform portions of a turbine engine component.

A second diffusion heat treatment may be performed after the coating has been applied over the chromizing coating. The second diffusion heat treatment may be performed at a temperature in the range of about 1950 to 2000 degrees Fahrenheit for a time period in the range of from about 1 to 5 hours. The heat treatment is preferably performed in an inert gas atmosphere, such as argon at a partial pressure of at least about 1000μ preferably from about 1000 to 5000μ so as not to deplete the chromium levels.

It has been found that by applying the chromizing coating and diffusing the chromium into the outer region of the substrate, and maintaining the chromium level in the outer region of the substrate at a level greater than 20 wt %, it is now possible to remove the coating, such as the MCrAlY coating, without causing damage to the substrate.

To strip a MCrAlY coating from a nickel based alloy substrate to which the chromium coating has been applied, one may immerse the substrate with the MCrAlY coating in an acid solution containing a sulfuric acid—hydrochloric acid mixture in water. The immersing step may comprise maintaining a sulfuric acid-hydrochloric acid mixture in water stripping solution at a temperature in the range of from about 120 to 180 degrees Fahrenheit and immersing the substrate into the stripping solution for a time period less than about 1 hour. Preferably, the chromium level in the chromizing coating is maintained at as high a level as possible and, particularly, at a level greater than 20 wt % Most preferably, the chromium level in the outer region of the substrate is maintained in the range of from 20 to 30 wt %. Maintaining a high chromium content is important to insure that the coating can prevent hot corrosion attack of the root in service and also to serve as an effective barrier to base alloy pitting during coating stripping. In a preferred embodiment, the stripping solution contains from about 20 to 30 vol % sulfuric acid and from about 3.0 to 8.0 vol % hydrochloric acid. In a most preferred embodiment, the stripping solution contains from about 23 to 27 vol % sulfuric acid and from about 4.0 to 6.0 vol % hydrochloric acid.

It has been found that using the stripping solution of the present invention there is a reduced level of base alloy attack such as pitting attack. The chromium enrichment of the base alloy forming the substrate during manufacture provides protection of the substrate alloy from corrosion during chemical stripping. This is because the chromium enrichment of the base alloy and the low aluminum content of the coating significantly increase its resistance to hydrochloric acid and/or sulfuric acid/hydrochloric acid mixtures. Further, the chromizing coating provides an effective barrier between the surface connected aluminum eutectic phase and the stripping solution.

Figure 2:
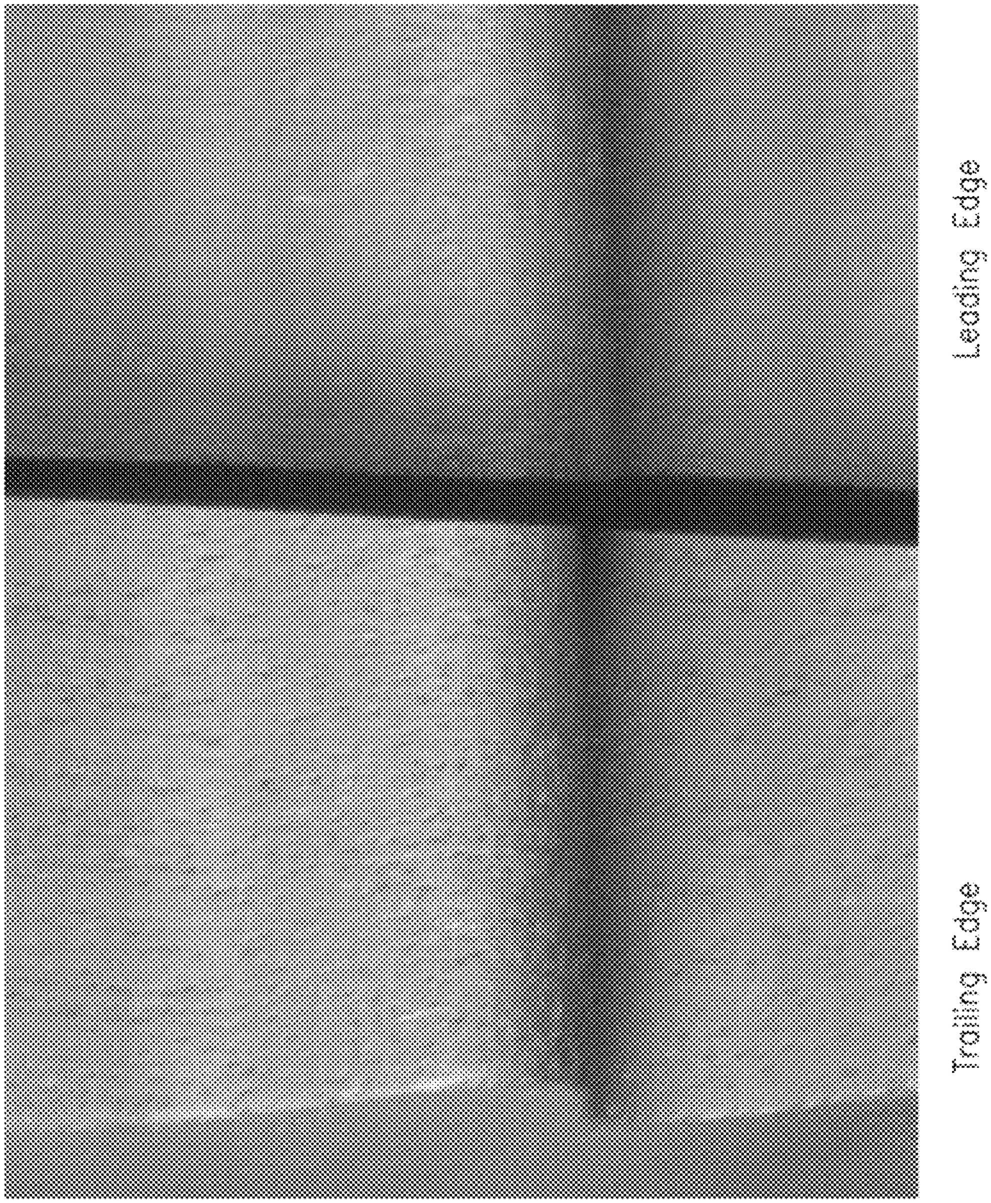
FIG. 2 is another side by side photographic comparison of a trailing edge portion of a root serration stripped by a prior art stripping solution and a leading edge of a root serration stripped by a stripping solution in accordance with the present invention.

Referring now to the drawings, FIG. 1 is a side by side comparison of a trailing edge of an airfoil portion whose coating had been stripped with a prior art hydrochloric acid solution (the left side of the figure) and a leading edge of an airfoil portion who coating had been stripped with the sulfuric—hydrochloric acid solution of the present invention (the right side of the figure). As can clearly be seen, there are many more pits in the trailing edge stripped by the prior art solution. FIG. 2 illustrates the same results with the left hand side being the trailing edge portion of a root serration stripped by the prior art solution and the right hand portion being the leading edge of a root serration stripped using a solution in accordance with the present invention.

Figure 3B:
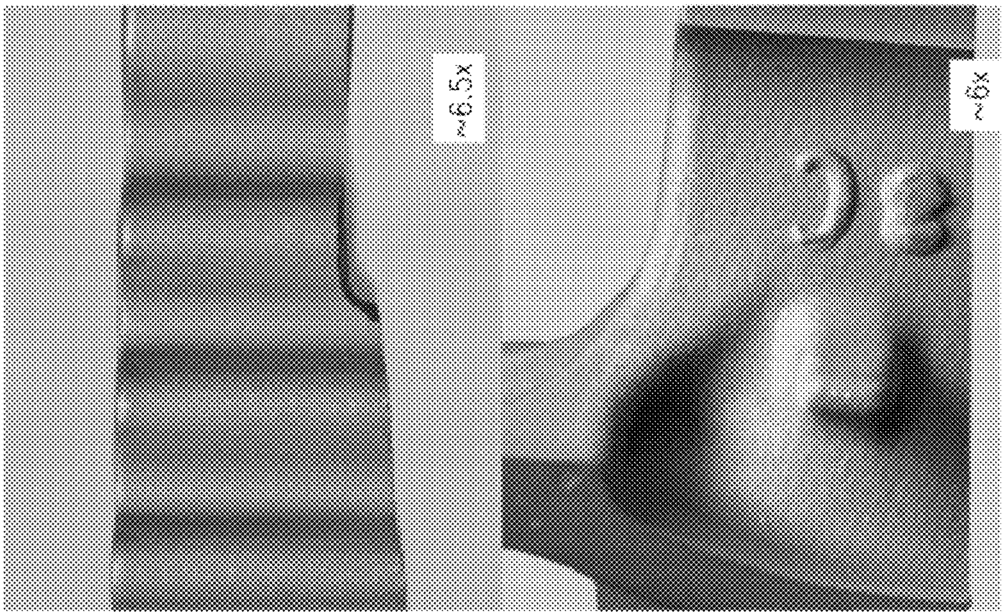
FIG. 3B is a photograph of a turbine blade whose coating had been stripped using the stripping solution of the present invention.
Figure 3A:
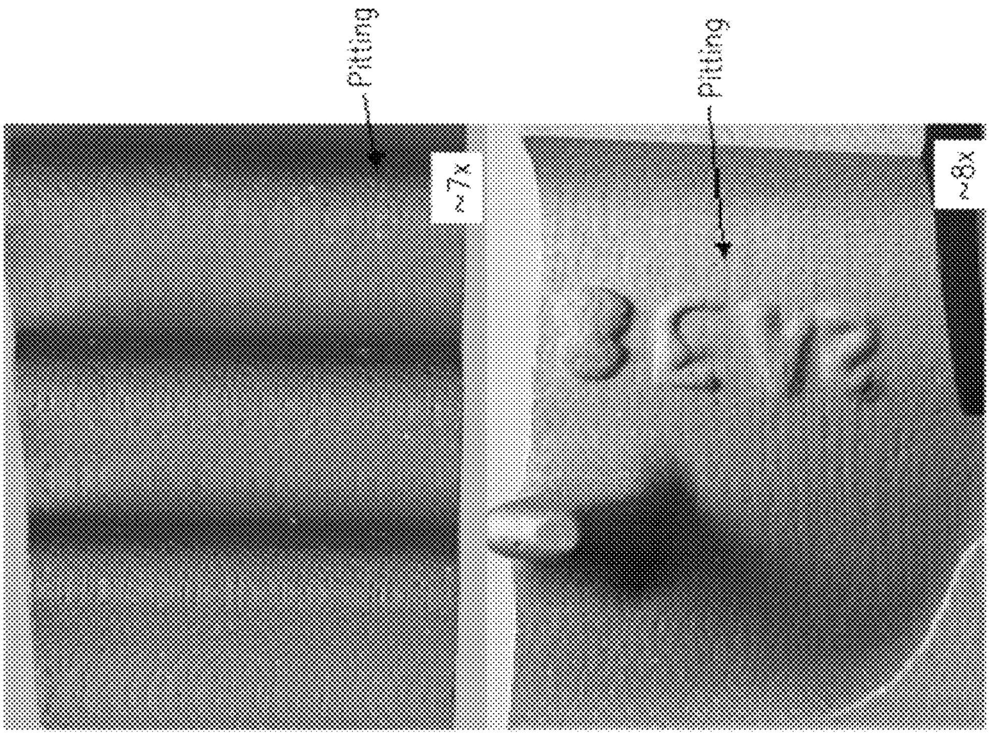
FIG. 3A is a photograph of a turbine blade whose coating had been stripped using a prior art stripping solution.

FIG. 3A shows a turbine blade formed from a nickel based superalloy which had its coating stripped using a prior art stripping solution with a one hour immersion in the solution. FIG. 3B shows the same turbine blade to which a chromizing coating had been applied followed by application of a MCrAlY coating and a diffusion heat treatment at 1975 degrees Fahrenheit for 4 hours in a vacuum. The coatings were then stripped using a stripping solution in accordance with the present invention. The blade with the MCrAlY coating was immersed in the stripping solution for 1 hour. It can be seen from these figures that there is far less pitting on the blade treated in accordance with the present invention.

It is apparent that there has been provided in accordance with the present invention a strip process for superalloys which fully satisfies the objects, means, and advantages set forth hereinbefore. While the present invention has been described in the context of specific embodiments thereof, other unforeseeable alternatives, modifications, and variations will become apparent to those skilled in the art having read the foregoing description. Accordingly, it is intended to embrace those unforeseeable alternatives, modifications, and variations as fall within the broad scope of the appended claims.

What is claimed is:

1. A strip process for removing a coating from a substrate comprising the steps of:

providing a nickel base alloy substrate having chromium diffused into an outer region and a MCrAlY coating deposited over said substrate with said diffused chromium; and removing said MCrAlY coating by immersing said nickel base alloy substrate in an acid solution which is a sulfuric acid-hydrochloric acid mixture in water consisting of from 20 to 30 vol % sulfuric acid and from 3.0 to 8.0 vol % hydrochloric acid and the balance water; and maintaining said acid solution at a temperature in the range of from about 120 to 180° F. and immersing said substrate with said coating being stripped in said acid solution for a time period less than about 1 hour.

2. The strip process according to claim 1, wherein said immersing step comprises immersing said substrate in a solution containing from about 23 to 27 vol % sulfuric acid and from about 4.0 to 6.0 vol % hydrochloric acid.

3. A strip process for removing a coating from a substrate comprising the steps of:

providing a nickel base alloy substrate having a MCrAlY coating deposited over the substrate; and removing said MCrAlY coating by immersing said nickel base alloy substrate in an acid solution consisting of a sulfuric acid-hydrochloric acid mixture in water, wherein said immersing step comprises maintaining said acid solution at a temperature in the range of from about 120 to 180° F. and immersing said substrate with said coating being stripped in said solution for a time period less than about 1 hour.

4. The strip process according to claim 3, wherein said immersing step comprises immersing said substrate in a solution containing from about 20 to 30 vol % sulfuric acid and from about 3.0 to 8.0 vol % hydrochloric acid in water.

5. The strip process according to claim 3, wherein said immersing step comprises immersing said substrate in a solution containing from about 23 to 27 vol % sulfuric acid and from about 4.0 to 6.0 vol % hydrochloric acid in water.

* * * * *